(12) United States Patent
Hopper et al.

(10) Patent No.: US 6,395,644 B1
(45) Date of Patent: *May 28, 2002

(54) PROCESS FOR FABRICATING A SEMICONDUCTOR DEVICE USING A SILICON-RICH SILICON NITRIDE ARC

(75) Inventors: Dawn M. Hopper, San Jose; Minh Van Ngo, Fremont; David K. Foote, San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 78 days.

(21) Appl. No.: 09/484,606

(22) Filed: Jan. 18, 2000

(51) Int. Cl.[7] .................... H01L 21/302; H01L 21/461
(52) U.S. Cl. .................. 438/738; 438/199; 438/299; 438/216; 438/287; 438/744; 438/735; 438/791; 438/952
(58) Field of Search ................... 438/636, 724, 438/757, 735, 736, 738, 744, 652, 669, 761, 740, 952, 199, 299, 216, 287, 778, 791

(56) References Cited

U.S. PATENT DOCUMENTS

| | | | | | |
|---|---|---|---|---|---|
| 4,690,728 A | * | 9/1987 | Tsang et al. | ................ | 156/643 |
| 5,441,914 A | * | 8/1995 | Tarf et al. | ................... | 437/189 |
| 5,539,249 A | * | 7/1996 | Roman et al. | ............. | 257/659 |
| 5,883,011 A | * | 3/1999 | Lin et al. | .................... | 438/747 |
| 5,946,580 A | * | 8/1999 | Wu | ............................ | 438/303 |
| 5,977,601 A | * | 11/1999 | Yang et al. | ................ | 257/437 |
| 6,030,541 A | * | 2/2000 | Adkisson et al. | ............ | 216/51 |

* cited by examiner

Primary Examiner—Tuan H. Nguyen
Assistant Examiner—Thanhha Pham
(74) Attorney, Agent, or Firm—Eschweiler & Associates, LLC

(57) ABSTRACT

A process for fabricating a semiconductor device using an ARC layer includes the formation of a silicon-rich silicon nitride material to provide an anti-reflective layer over a electrically conductive or semiconductor surface. The silicon-rich silicon nitride material is plasma deposited to provide a material having a desired refractive index, thickness uniformity, and density. The process includes the formation of a device layer on a semiconductor substrate. The device layer includes at least a silicon layer and a silicon oxide layer. A silicon-rich silicon nitride layer is formed to overlie the device layer. The silicon-rich silicon nitride material can be selectively etched, such that the silicon material and the silicon oxide material in the underlying device layer are not substantially etched.

9 Claims, 5 Drawing Sheets

PROCESS FOR FABRICATING A SEMICONDUCTOR DEVICE USING A SILICON-RICH SILICON NITRIDE ARC

RELATED APPLICATIONS

This invention relates, in general, to a process for fabricating a semiconductor device, and more particularly, to a process for a lithographically defining patterned features in a semiconductor device.

BACKGROUND OF THE INVENTION

In order to build faster and more complex integrated circuits, semiconductor manufacturers have increased the number of components in the integrated circuit, while reducing the overall size of the circuit. The small circuit size requires device components be defined to smaller and smaller dimensions. In addition, the small circuit size requires multiple overlying conductive layers to electrically interconnect the vast number of components within the integrated circuit. To achieve high performance levels, the electrical interconnects must be fabricated in dense arrays with minimal spacing between each conductive lead. As the need to fabricate numerous electrical interconnect leads at very high densities increases, demands are placed on photolithographic technology to accurately transfer lithographic patterns into underlying conductive layers.

Conventional photolithography involves the formation of a lithographic pattern on an underlying layer to which the lithographic pattern is to be transferred. Typically, in an optical process, a layer of photoresist is spin-coated onto an underlying layer. The photoresist is exposed to a preselected wavelength of light to cause a photo-sensitive chemical reaction to occur in the photoresist. After exposure, the photoresist is developed to remove portions of the photoresist and to leave a pattern on the underlying layer. The pattern is then transferred into the underlying layer by performing an etching process using the patterned photoresist as an etching mask.

As the feature size of the lithographic pattern is reduced, inaccuracies in the pattern transfer process can arise from optical limitations inherent in the lithographic process. For example, during the formation of metal leads, light reflection from the surface of the underlying metal layer can cause distortions in the developed photoresist patterns.

To control the reflection of light from the metal surface, conventional photolithographic processes employ an anti-reflective coating process (ARC) that is positioned between the underlying layer and the photoresist. Anti-reflective coatings are conventionally made of various materials, including organic and inorganic materials. For example, inorganic materials conventionally employed for ARCs includes silicon nitride, silicon oxynitride, titanium nitride, silicon carbide, and the like. Organic materials conventionally employed for ARCs include spin-on polyamides and polysulfones. The effective use of an ARC enables patterning, and alignment without reflective interference from the surface of the underlying layer. Reduction in light reflection improves both line width reproduction accuracy and mask alignment. These are critical process parameters that are necessary to achieve fine line conductive patterns at high densities. The use of an ARC is particularly beneficial when forming a via or contact hole over a stepped area. In these processes, a dielectric layer must be etched that has been deposited on a gate electrode overlying a semiconductor substrate. Light reflection from the gate electrode can distort the pattern geometry of the opening.

Despite the development and use of ARCs, conventional photolithographic techniques are a limiting factor in the reduction of feature sizes in integrated circuit devices. Accordingly, a need exists for materials that have the requisite optical properties for use as a ARC, and that enable accurate control of line width of conductive features. An important aspect of the ARC is that it withstands the etching processes used to transfer patterns from the photoresist into underlying conductive materials. Additionally, the ARC must have a chemical composition, such that it can be removed without damaging underlying patterned features. Accordingly, a need exists for further development of ARC materials that can provide the needed enhancement of conventional photolithographic pattern transfer processes.

BRIEF SUMMARY OF THE INVENTION

The present invention is for a process for fabricating a semiconductor device that includes the formation of an anti-reflective layer that is resistant to etching processes used to remove exposed portions of underlying layers. In a preferred embodiment of the invention, the anti-reflective layer includes a silicon-rich silicon nitride material. The silicon-rich silicon nitride material is not reactive with etchants used to remove dielectric materials that form portions of pattern features in an integrated circuit device. By incorporating excess silicon, the silicon nitride material can be adjusted to exhibit a desired refractive index and absorption coefficient. Additionally, the silicon-rich silicon nitride is resistant to etchants that react with dielectric materials, such as silicon oxide. Additionally, the silicon-rich silicon nitride is resistant to etchants that are reactive with semiconductor materials, such as single-crystal silicon and polycrystalline silicon.

In one embodiment, a semiconductor substrate is provided and a device layer is formed on the semiconductor substrate. The device layer includes at least a silicon layer and a silicon oxide layer. An anti-reflective layer that includes a silicon-rich silicon nitride layer is plasma deposited onto the device layer.

Figure 1:
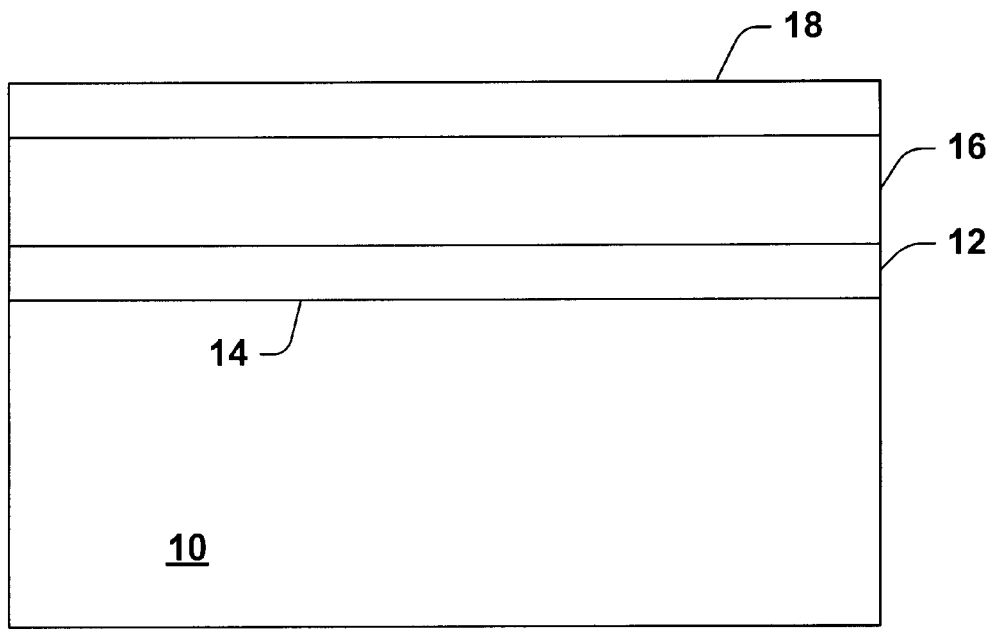
FIGS. 1–4 illustrate, in cross-section, processing steps in accordance with one embodiment of the invention.

It will be appreciated that for simplicity and clarity of illustration, elements in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is a portion of a semiconductor substrate 10 having already undergone several processing steps in accordance with the invention. A dielectric layer 12 overlies a surface 14 of semiconductor substrate 10. A material layer 16 overlies dielectric layer 12. Material layer 16 can be a semiconductive material, such as polycrystalline silicon, amorphous silicon, and the like. Alternatively, material layer 16 can be a conductive layer, such as aluminum, an aluminum-silicon alloy, an aluminum-silicon-copper alloy, a silicon-copper alloy, a refractory metal, a refractory metal silicide, and the like. Further, dielectric layer 12 can be a silicon dioxide layer thermally grown on surface 14. Alternatively, dielectric layer 12 can be a deposited silicon oxide material. Further, dielectric layer 12 can be a composite dielectric material including a silicon oxide layer overlying surface 14, a silicon nitride layer overlying the silicon oxide layer and a top oxide layer overlying the silicon nitride layer. This type of composite dielectric layer is known in the art as an ONO layer.

In accordance with the invention, after forming material layer 16, an ARC layer 18 is formed to overlie material layer 16. In a preferred embodiment of the invention, ARC layer 18 is plasma deposited using a plasma-enhanced-chemical-vapor-deposition (PECVD) process. ARC layer 18 includes a silicon-rich silicon nitride material. In the PECVD process, the silicon-rich silicon nitride material is formed by flowing silane ($SiH_4$) and ammonia ($NH_3$) into a PECVD reactor. The silicon content in the silicon nitride material is controlled by regulating the flow-rate ratio of silane to ammonia. In general, as the flow rate of the silane is increased relative to the flow rate of ammonia, the silicon content of the silicon nitride material deposited in the PECVD reactor increases. Additionally, as the silicon content of the silicon nitride material increases, the refractive index concomitantly increases. Accordingly, both the silicon content of the silicon nitride material and the refractive index of the silicon nitride material can be affected by regulating the ratio of silane to ammonia within the PECVD reactor.

In a preferred embodiment of the invention, a silicon-rich silicon nitride layer is deposited by flowing about 3500 sccm nitrogen, about 10 sccm to about 100 sccm, and more preferably, about 50 sccm silane, and about 2 sccm to about 50 sccm, and more preferably, about 10 sccm ammonia into a PECVD reactor. The resulting silicon-rich silicon nitride film exhibits a refractive index of preferably about 1.7 to about 2.5, and more preferably about 2.1, and extinction coefficient preferably from about 0.2 to about 0.9, and more preferably, about 0.3.

In addition to providing a desired silicon content and refractive index, the inventive process results in the formation of an ARC layer having a uniform thickness over surface 14. For example, where the PECVD process is carried out to form an ARC layer having a thickness of preferably about 100 Angstroms to about 1,000 Angstroms, and more preferably, about 200 Angstroms the total thickness variation in the ARC layer ranges from about 1% to about 3%. By providing an ARC layer having minimal thickness variation, the control of unwanted reflection from the surface of material layer 16 is improved.

The PECVD process of the invention also forms a silicon-rich silicon nitride layer at a temperature that is substantially below other chemical vapor deposition techniques, such as low-pressure-chemical-vapor-deposition (LPCVD). The relatively low deposition temperature advantageously avoids thermally-induced diffusion of dopants in the substrate and in underlying layers. Additionally, the PECVD process also forms a low-density ARC layer. A silicon-rich silicon nitride film deposited by PECVD is also very uniform in thickness access the substrate. Further, the PECVD process of the invention provides a silicon-rich silicon nitride layer that is substantially free of oxides. By providing an ARC layer having a relatively low density and substantially devoid of oxides, the ARC layer can be efficiently removed by conventional etching processes.

Figure 2:
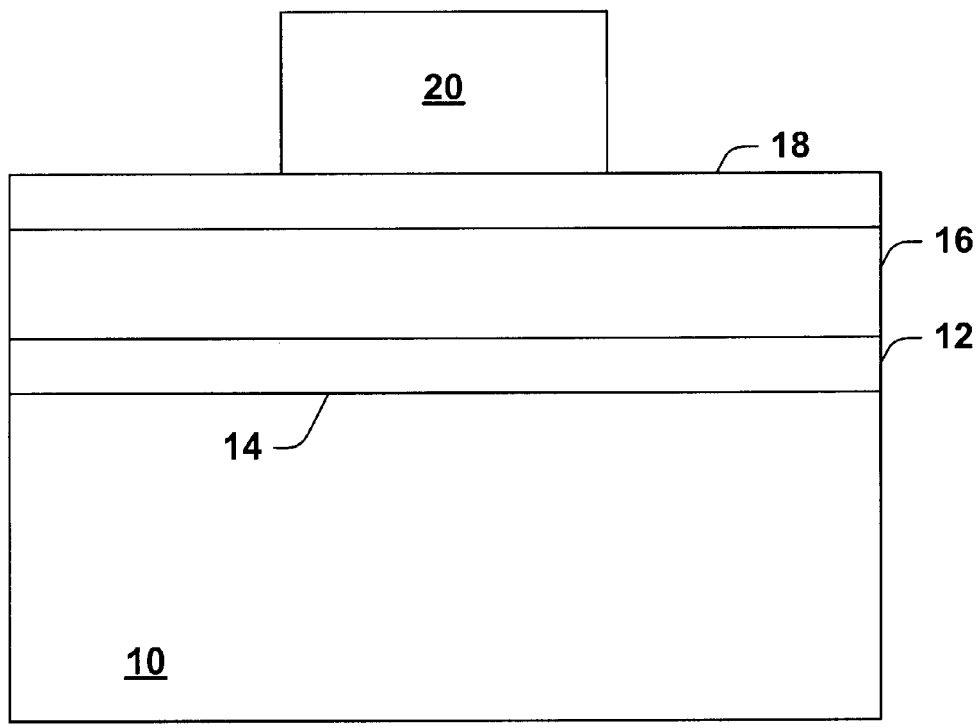

The inventive process continues with the formation of a photoresist pattern 20, as illustrated in FIG. 2. Photoresist pattern 20 is formed by providing a layer of photoresist material overlying the surface of ARC layer 18. The photoresist layer can be applied using any of a number of known techniques, such as spin-coating and the like. Once the photoresist layer is applied, a baking process is carried out to remove moisture from the photoresist material. The baked photoresist is then exposed to a selected wavelength of light in a lithographic alignment apparatus. The alignment apparatus aligns a reticle on a photoresist mask to the uppermost surface overlying semiconductor substrate 10. The alignment of the reticle to semiconductor substrate 10 is a critical process that requires extremely exact positioning. During the alignment process, any light reflection from the surface of material layer 16 can interfere with the precise alignment of the reticle to the semiconductor substrate 10. The unwanted light reflection is minimized by adjusting the refractive index of ARC layer 18 as described above.

Once reticle alignment is complete, the photoresist is exposed to the selected wavelength of light, which induces photo-catalytic chemical reactions to occur within the photoresist material. After exposure, the photoresist is developed by placing semiconductor substrate 10 in a developing solution and removing portions of the photoresist layer. The portions of the photoresist layer that are removed will depend upon whether the photoresist used is a positive-acting photoresist or a negative-acting photoresist. In a positive-acting photoresist, the portions of the photoresist exposed to the selected wavelengths of light will be etched away in the developer solution, while in a negative-acting photoresist, the portions exposed to the selected wavelengths of light will not be etched away by the developer solution.

Figure 3:
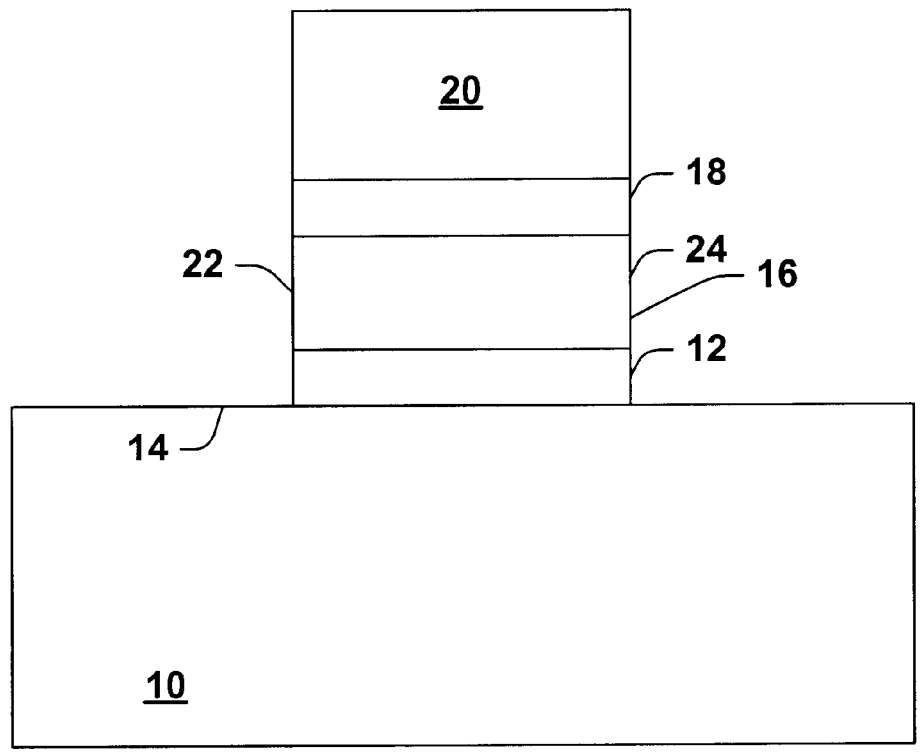

After forming photoresist pattern 20, an etching process is carried out to transfer the photoresist pattern into the underlying layers, as illustrated in FIG. 3. Preferably, the underlying layers are anisotropically etched. The anisotropic etching process sequentially removes ARC layer 18, material layer 16 and dielectric layer 12. The anisotropic etching process removes the underlying layers in a vertical direction, while not substantially etching in a lateral direction. Accordingly, substantially vertical edges 22 and 24 are formed in the underlying layers. Unwanted reflection of light from material layer 16 can cause reticulation in photoresist pattern 20. When this happens, edges 22 and 24 can be uneven resulting in improperly formed device components. In accordance with the invention, unwanted reflection from the surface of material layer 16 is substantially reduced by forming ARC layer 18 to have a desired refractive index.

Figure 4:
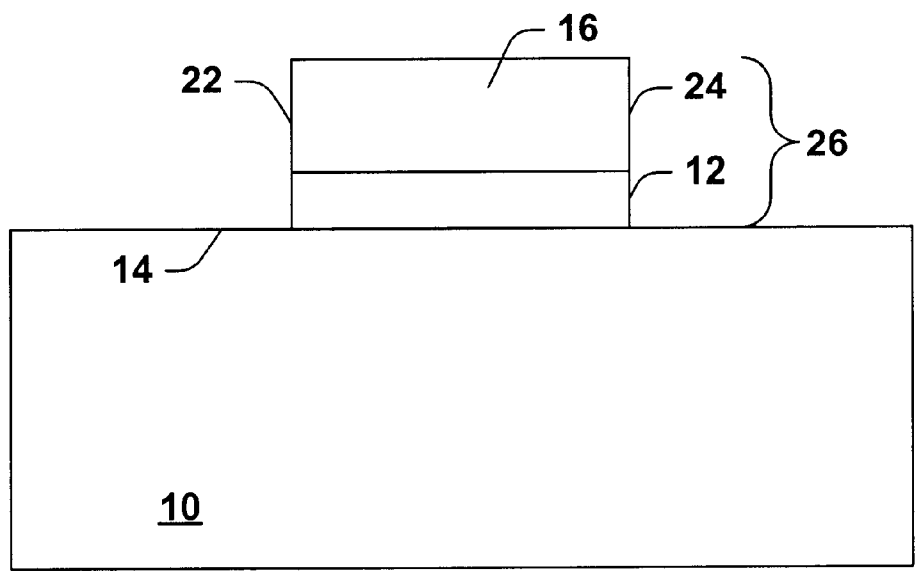

Once the underlying layers are etched, photoresist pattern 20 and ARC layer 18 are removed, as illustrated in FIG. 4. Photoresist pattern 20 can be removed using conventional photoresist stripping techniques. In one method, photoresist pattern 20 is removed by a plasma ashing process. Further, photoresist layer pattern 20 can be removed by wet chemical etching It is important to note that the silicon-rich silicon nitride material of ARC layer 18 is resistant to photoresist stripping chemicals.

In accordance with the invention, after stripping photoresist pattern 20, ARC layer 18 is removed by a wet chemical or dry plasma etching process. In accordance with the invention, dielectric layer 12 is a silicon oxide layer, either a wet chemical etch or a dry plasma etch can be used. The wet chemical etching process isotropically etches away ARC layer 18, while not substantially etching either material layer 16 or dielectric layer 12. In a preferred embodiment of the invention, ARC layer 18 is etched using phosphoric acid ($H_3PO_4$) etching chemistry. The etching process selectively removes the silicon-rich silicon nitride component of ARC layer 18, yet does not substantially react with the materials of material layer 16 or dielectric layer 12. Specifically, where material layer 16 is polycrystalline silicon and dielectric layer 12 is silicon dioxide, neither the polycrystalline silicon nor the silicon dioxide are substantially etched by the wet chemical etch used to selectively remove ARC layer 18. Alternatively, where dielectric layer 12 is silicon nitride or ONO, an oxygen plasma etch is preferably used to remove ARC layer 18. Those skilled in the art will appreciate that the ability to selectively remove ARC layer 18 using a wet or dry etching process permits the easy removal of an ARC, while not adversely affecting the underlying device layer.

Collectively, material layer 16 and dielectric layer 12 can collectively be referred to as a device layer 26. Device layer 26 can form one of a number of components commonly found in an integrated circuit. For example, device layer 26 can be a gate electrode and underlying gate dielectric layer for a metal-oxide-semiconductor (MOS) transistor, or another component such as a resistor, and the like. Further, device layer 26 can exclude an underlying dielectric layer and can be a metal lead, or a metal interconnect structure. Those skilled in the art will recognize that a wide variety of device components can be fabricated using the fabrication process described above. Accordingly, the fabrication of all such device components is contemplated by the present invention.

Figure 5:
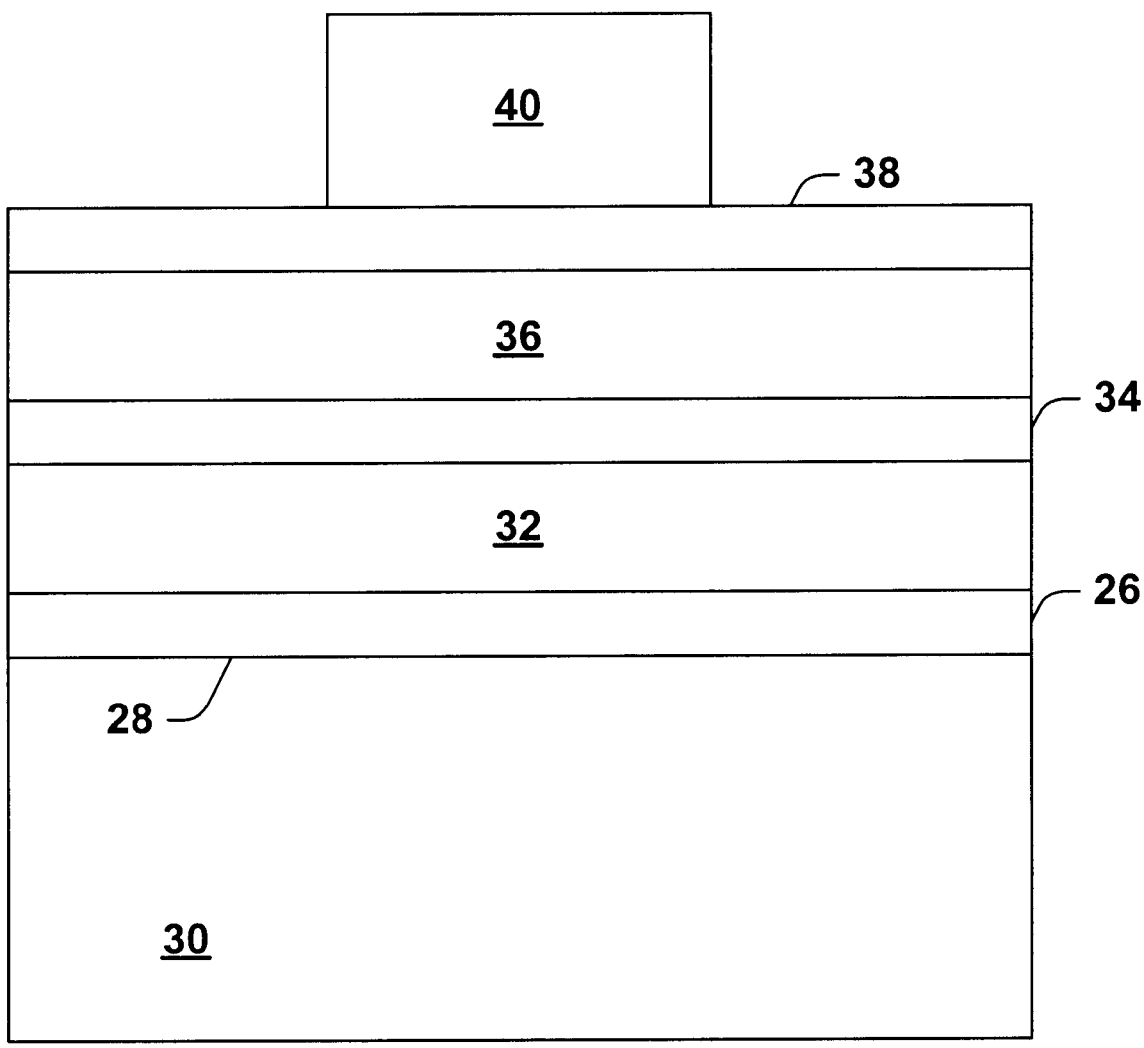
FIGS. 5–7 illustrate, in cross-section, processing steps in accordance with another embodiment of the invention.

In another embodiment of the invention, a process for the fabrication of a stacked-gate advantageously incorporates a silicon-rich silicon nitride ARC layer. As illustrated in FIG. 5, the stacked gate structure is fabricated by initially forming a first dielectric layer 26 overlying a surface 28 of a semiconductor substrate 30. A first conductive layer 32 is formed to overlie first dielectric layer 26. First conductive layer can be, for example, polycrystalline silicon doped with an n-type dopa, such as phosphorus or arsenic, to impart electrical conductivity to the polycrystalline silicon. Alternatively, first conductive layer 32 can be a refractory metal silicide, and the like.

A second dielectric layer 34 is formed to overlie first conductive layer 32. In a stacked gate structure used in a non-volatile memory device, such as an electrically-erasable-read-only-memory (EEPROM) device, second dielectric layer 34 is typically ONO layer. Alternatively, second dielectric layer 34 can be a deposited silicon oxide layer, and the like.

A second conductive layer 36 is formed to overlie second dielectric layer 34. Preferably, second conductive layer 36 is fabricated using a material substantially similar to that used to fabricate first conductive layer 32. After forming second conductive layer 36, an ARC layer 38 is formed to overlie second conductive layer 36. As in the previous embodiment, ARC layer 38 includes a silicon-rich silicon nitride material. The deposition process is substantially that described in the previous embodiment and the refractive index of ARC layer 38 is controlled by regulating the flow rate ratio of silane and ammonia in a PECVD reactor.

After forming ARC layer 38, a photoresist pattern 40 is formed to overlie ARC layer 38. The process for the formation of resist pattern 40 is substantially the same as described above in the foregoing embodiment. During the formation of photoresist pattern 40, as described above, portions are washed away during development as a result of a chemical reaction between the developer solution and the removed portions of the photoresist. It is important to note that the silicon-rich silicon nitride material of both ARC layers 18 and 38 is resistant to the developer solution. For example, where the developer solution is a commonly used organic solvent, lithographic material, such as positive and negative acting photoresist, is removed by the developer solution at a rate substantially greater than the removal rate of the silicon-rich silicon nitride material. Accordingly, should it be necessary to rework photoresist patterns 20 or 40, the photoresist pattern can be removed without compromising the structural integrity of the ARC layer.

Figure 6:
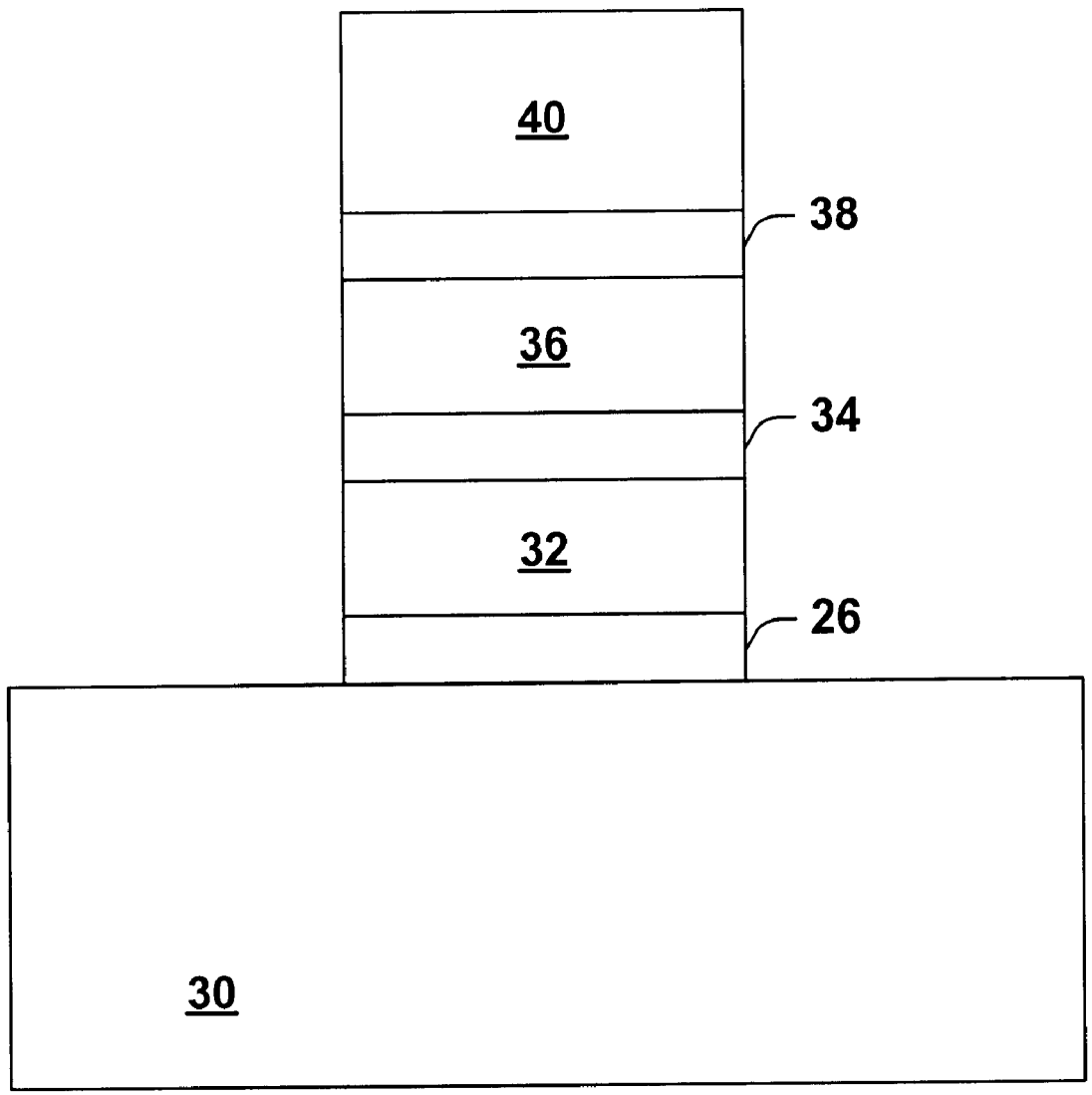
Figure 7:
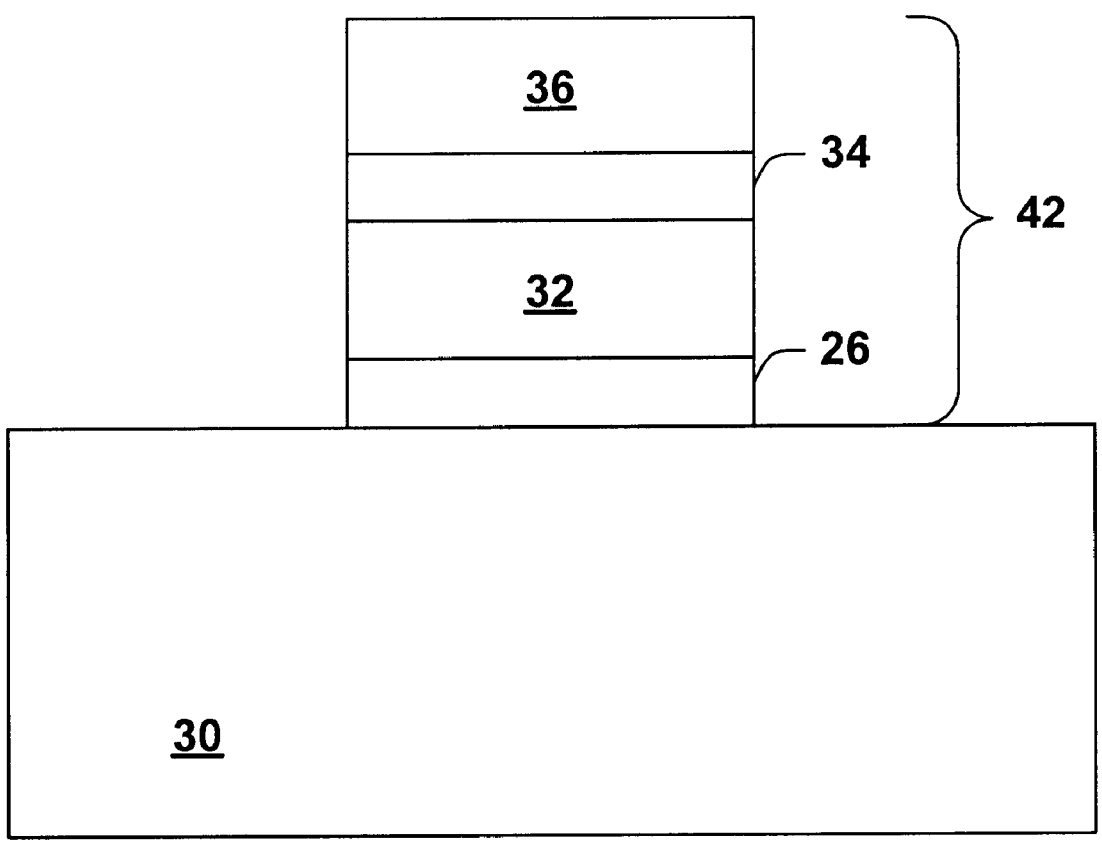

Referring to FIG. 6, a sequential etching process is carried out to sequentially etch ARC layer 38, second conductive layer 36, second dielectric layer 34, first conductive layer 32, and first dielectric layer 26. Upon completion of the sequential etching process, photoresist pattern 40 and ARC layer 38 are removed, as illustrated in FIG. 7. Photoresist pattern 40 is preferably removed by means of a conventional resist stripping, such as plasma ashing, and the like. Additionally, where second dielectric layer 34 is a silicon oxide layer, ARC layer 38 is preferably removed by a wet chemical etching process using phosphoric acid. The wet chemical etching process selectively removes ARC layer 38, while not substantially etching first and second conductive layers 32 and 36 or first and second dielectric layers 26 and 34. Alternatively, where second dielectric layer 34 is a silicon nitride layer or an ONO layer an oxygen plasma etch is preferably used to etch ARC layer 38.

Accordingly, the process of the invention fabricates a stacked-gate structure 42 that includes two gate electrodes separated by a dielectric layer. The stacked-gate structure fabricated in accordance with the invention can be utilized in a non-volatile memory device for storage of electrical charge. It is important to note that utilization of a silicon-rich silicon nitride material in an ARC layer that is susceptible to selective etching results in the fabrication of a stacked-gate structure that is not damaged by the ARC removal process.

Thus it is apparent that there has been disclosed, in accordance with the invention, a process for fabricating a semiconductor device using an ARC layer that fully provides the advantages set forth above. Although the process has been described and illustrated with reference to specific illustrative embodiments thereof, it is not intended that the invention be limited to those illustrative embodiments. Those skilled in the art will recognize that variations and modifications can be made without departing from the spirit of the invention. For example, the inventive process can be used to fabricate a wide variety of components in an integrated circuit device beyond those described in the illustrative embodiments. For example, the process can be used to fabricate via structures, contact structures, interconnect structures, and the like. It is therefore intended to include within the invention all such variations and modification as fall within the scope of the appended claims.

What is claimed is:

1. A process for fabricating a semiconductor device comprising the steps of:

providing a semiconductor substrate;

forming a device layer on the semiconductor substrate, wherein the device layer includes at least a semiconductive silicon layer and a silicon oxide layer;

plasma depositing a selectively-etchable antireflective layer onto the device layer, wherein the device layer is not patterned prior to plasma depositing the selectively-etchable antireflective layer and the selectively-etchable antireflective layer includes a silicon-rich silicon nitride material having a thickness of about 100 angstroms to about 1,000 angstroms and a thickness variation of about 1–3%;

patterning the selectively-etchable antireflective layer and the device layer, and subsequently;

removing the selectively-etchable antireflective layer using an etching process, wherein the etching process removes the selectively-etchable reflective layer, while not substantially etching the device layer.

2. The process of claim 1, wherein the step of plasma depositing a selectively-etchable antireflective layer comprises PECVD of silicon-rich silicon nitride.

3. The process of claim 2, wherein the step of plasma depositing a silicon-rich silicon nitride layer comprises flowing about 10 sccm to about 100 sccm silane and about 2 sccm to about 50 sccm of ammonia.

4. The process of claim 1, wherein the step of forming silicon-rich silicon nitride comprises forming a layer having a refractive index of about 1.7 to about 2.5.

5. The process of claim 1, wherein the step of plasma depositing a selectively-etchable antireflective layer comprises PECVD of oxide-free, silicon-rich silicon nitride.

6. The process of claim 1, wherein the step of forming a device layer comprises the steps of:

forming a silicon oxide layer overlying the semiconductor substrate; and forming a polycrystalline silicon layer overlying the silicon oxide layer.

7. The process of claim 1, wherein the etching process comprises a wet etching process using phosphoric acid.

8. The process of claim 1, wherein the step of forming a device layer comprises the steps of:

forming a first silicon oxide layer overlying the substrate;

forming a first polycrystalline silicon layer overlying the first silicon oxide layer;

forming a second silicon oxide layer overlying the first polycrystalline silicon layer; and forming a second polycrystalline silicon layer overlying the second silicon oxide layer.

9. The process of claim 1, wherein said patterning the selectively-etchable antireflective layer comprises anisotropically etching sequentially the selectively-etchable antireflective layer and the device layer.

* * * * *